(12) United States Patent
Lis et al.

(10) Patent No.: US 12,374,661 B2
(45) Date of Patent: Jul. 29, 2025

(54) POWER MODULE HAVING VERTICALLY ALIGNED FIRST AND SECOND SUBSTRATES

(71) Applicant: Infineon Technologies AG, Neubiberg (DE)

(72) Inventors: Adrian Lis, Regensburg (DE); Ewald Guenther, Regenstauf (DE); Thomas Schmid, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 545 days.

(21) Appl. No.: 17/881,682

(22) Filed: Aug. 5, 2022

(65) Prior Publication Data

US 2024/0047429 A1 Feb. 8, 2024

(51) Int. Cl.
| H01L 25/07 | (2006.01) |
| H01L 21/66 | (2006.01) |
| H01L 23/00 | (2006.01) |
| H01L 23/373 | (2006.01) |
| H01L 25/00 | (2006.01) |

(52) U.S. Cl.
CPC ............ *H01L 25/072* (2013.01); *H01L 22/22* (2013.01); *H01L 23/3735* (2013.01); *H01L 24/48* (2013.01); *H01L 25/50* (2013.01); *H01L 2224/48225* (2013.01)

(58) Field of Classification Search
None
See application file for complete search history.

(56) References Cited

U.S. PATENT DOCUMENTS

| 9,520,345 B2 | 12/2016 | Ishino et al. | |
| 10,403,601 B2 | 9/2019 | Im et al. | |
| 2019/0341332 A1* | 11/2019 | Lin | H01L 23/3121 |
| 2020/0035579 A1* | 1/2020 | Hoegerl | H01L 23/3121 |

* cited by examiner

*Primary Examiner* — Cory W Eskridge
(74) *Attorney, Agent, or Firm* — Murphy, Bilak & Homiller, PLLC

(57) ABSTRACT

A power module includes: a first substrate having a patterned first metallization; a second substrate vertically aligned with the first substrate and having a patterned second metallization that faces the patterned first metallization; first vertical power transistor dies having a drain pad attached to a first island of the patterned first metallization and a source pad electrically connected to a first island of the patterned second metallization via first spacers; and second vertical power transistor dies having a source pad electrically connected to the first island of the patterned first metallization via second spacers. A first subset of the second vertical power transistor dies has a drain pad attached to a second island of the patterned second metallization. A second subset of the second vertical power transistor dies has a drain pad attached to a third island of the patterned second metallization. A method of producing the module is described.

20 Claims, 11 Drawing Sheets

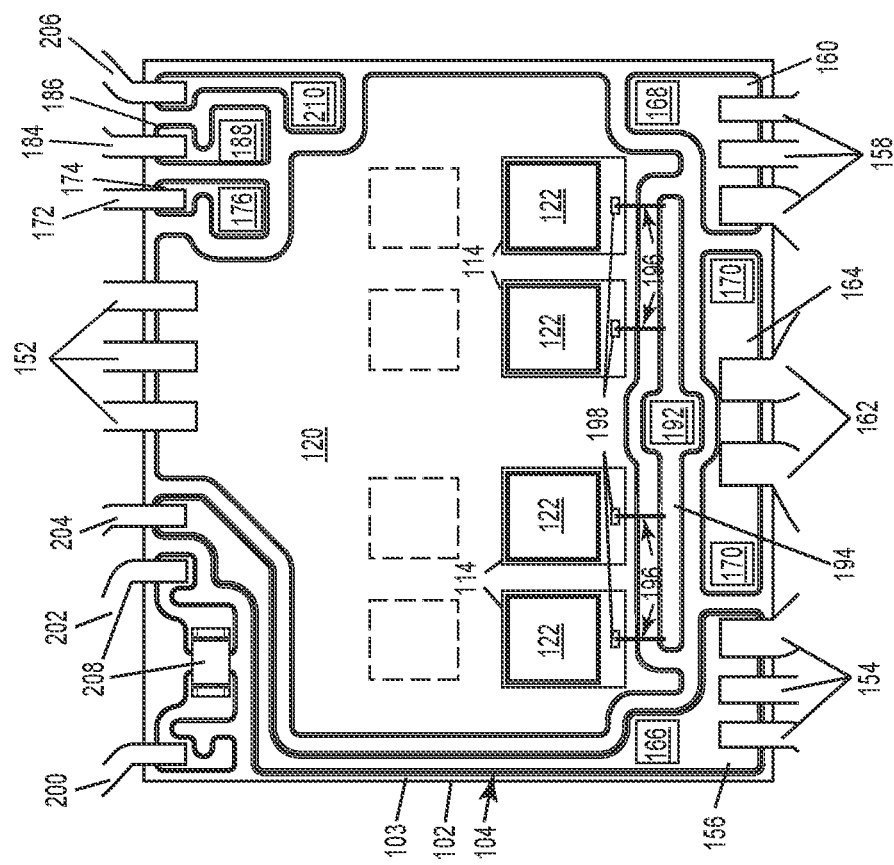
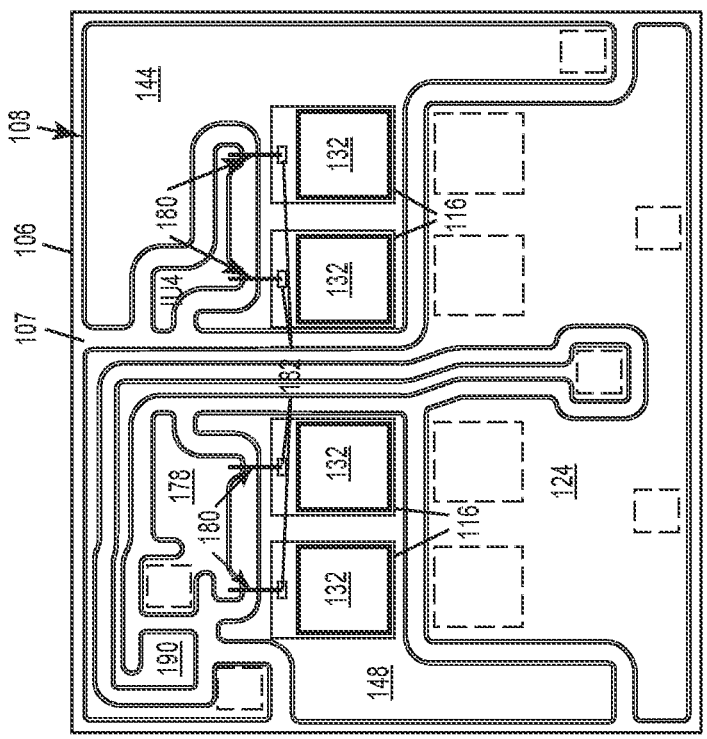
FIG. 4A
FIG. 4B

POWER MODULE HAVING VERTICALLY ALIGNED FIRST AND SECOND SUBSTRATES

BACKGROUND

Power modules often have a half bridge configuration with a high-side switch and a low-side switch in the same module. Each switch is typically formed from 1 to 4 power transistor dies (chips), which results in a total of 2 to 8 dies per module. In the case of SiC transistor dies for implementing the half bridge switches, SiC technology is more expensive compared to Si technology. However, SiC technology delivers higher voltage operation, wider temperature ranges, and increased switching frequencies when compared to existing Si technology. Thermal optimization is an issue with power modules, especially in the case of a fully populated power module with 8 SiC transistor dies. Strong thermal coupling between the SiC dies arises since the distances between the single SiC dies are relatively short. Also, the top die carrier substrate of the power module only contributes about 30% to the total heat dissipation. This means that relatively expensive SiC dies and the top substrate are not fully exploited with respect to thermal performance in conventional power module designs.

Hence, there is a need form an improved power module design with optimized thermal performance.

SUMMARY

According to an embodiment of a power module, the power module comprises: a first substrate having a patterned first metallization; a second substrate vertically aligned with the first substrate and comprising a patterned second metallization that faces the patterned first metallization; a first plurality of vertical power transistor dies having a drain pad attached to a first island of the patterned first metallization and a source pad electrically connected to a first island of the patterned second metallization via a first plurality of spacers; and a second plurality of vertical power transistor dies having a source pad electrically connected to the first island of the patterned first metallization via a second plurality of spacers, wherein a first subset of the second plurality of vertical power transistor dies has a drain pad attached to a second island of the patterned second metallization and a second subset of the second plurality of vertical power transistor dies has a drain pad attached to a third island of the patterned second metallization.

According to an embodiment of a method of producing a power module, the method comprises: attaching a drain pad of a first plurality of vertical power transistor dies to a first island of a patterned first metallization of a first substrate; attaching a drain pad of a first subset of a second plurality of vertical power transistor dies to a second island of a patterned second metallization of a second substrate; attaching a drain pad of a second subset of the second plurality of vertical power transistor dies to a third island of the patterned second metallization; vertically aligning the second substrate having the second plurality of vertical power transistor dies attached thereto with the first substrate having the first plurality of vertical power transistor dies attached thereto, such that the patterned second metallization faces the patterned first metallization; after the vertically aligning, electrically connecting a source pad of the first plurality of vertical power transistor dies to a first island of the patterned second metallization via a first plurality of spacers and electrically connecting a source pad of the second plurality of vertical power transistor dies to the first island of the patterned first metallization via a second plurality of spacers.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4A is a plan view of a first substrate of the power module.

FIG. 4B is a plan view of a second substrate of the power module.

DETAILED DESCRIPTION

The embodiments described herein provide a power module design where some power semiconductor dies are attached to a lower substrate of the power module and other power semiconductor dies are attached to an upper substrate of the power module, with spacers that provide corresponding vertical connections to the opposite substrate. The module substrates are vertically aligned with one another such that a patterned metallization of one substrate faces a patterned metallization of the other substrate. For example, in the case of a half bridge power module, vertical power transistor dies that form the low-side switch of a half bridge may be attached to the lower substrate of the power module and vertical power transistor dies that form the high-side switch of the half bridge may be attached to the upper substrate of the power module, or vice-versa. The high-side vertical power transistor dies and the low-side vertical power transistor dies are thermally decoupled from one another with such a design, since the high-side vertical power transistor dies and the low-side vertical power transistor dies are attached to different substrates and therefore vertically spaced apart from one another. In the case of double-sided cooling, the main heat dissipation of the high-side vertical power transistor dies is through one side of the power module via one substrate and the main heat dissipation of the low-side vertical power transistor dies is through the opposite side of the module via the other substrate. A single-side cooling embodiment is also described.

Described next, with reference to the figures, are exemplary embodiments of the power module and methods of producing the power module. Any of the power module embodiments described herein may be used interchangeably unless otherwise expressly stated.

Figure 1:
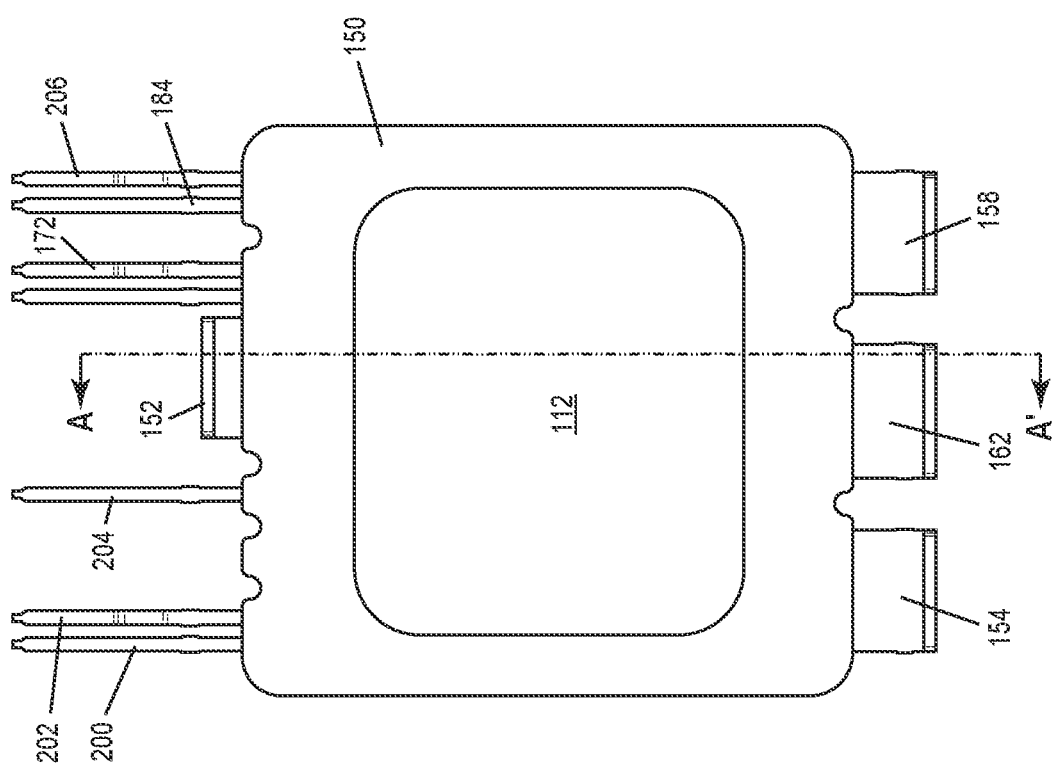
FIG. 1 illustrates a top plan view of an embodiment of a molded power module.
Figure 2:
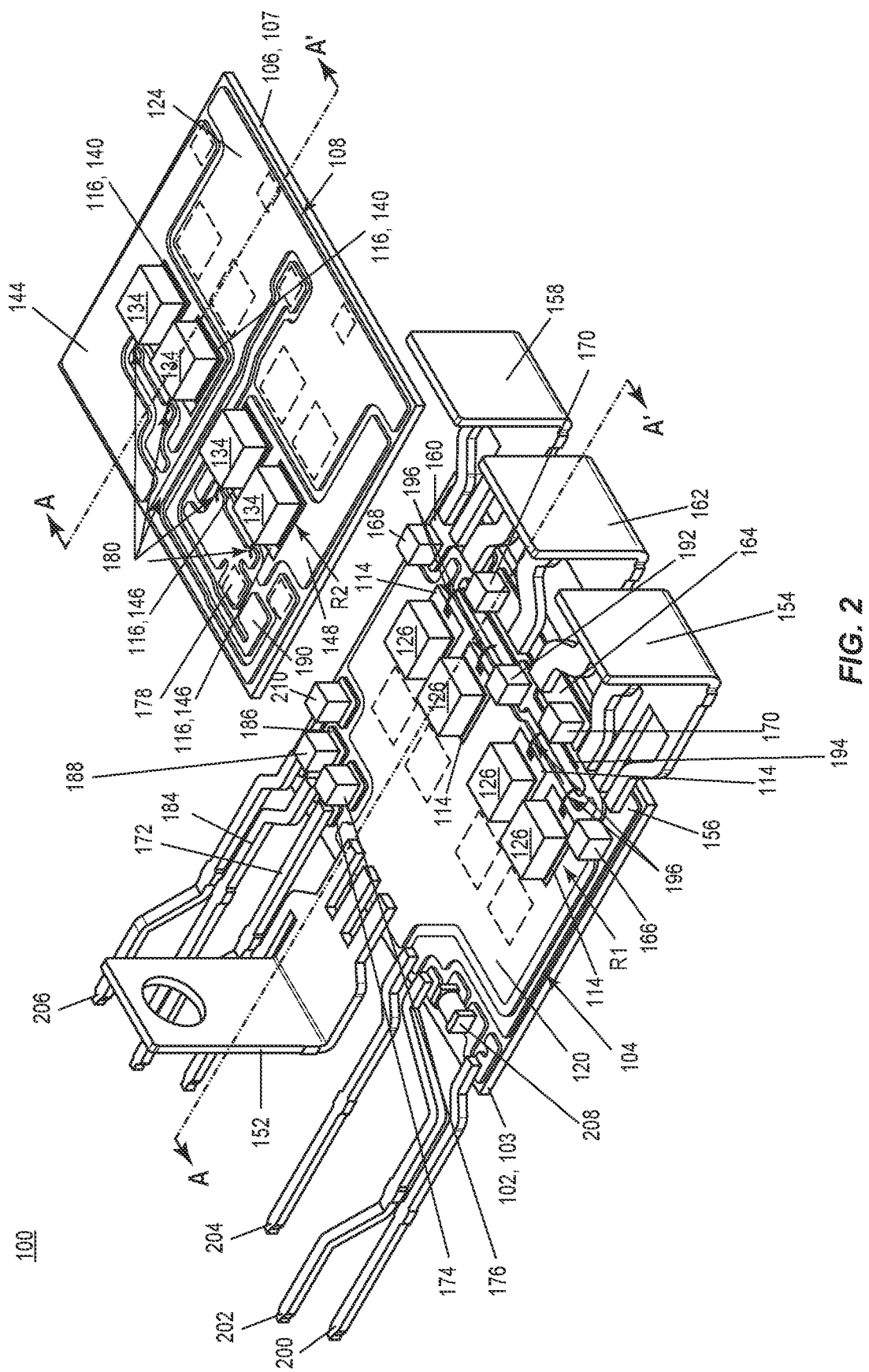
FIG. 2 illustrates a disassembled view of the power module.
Figure 3:
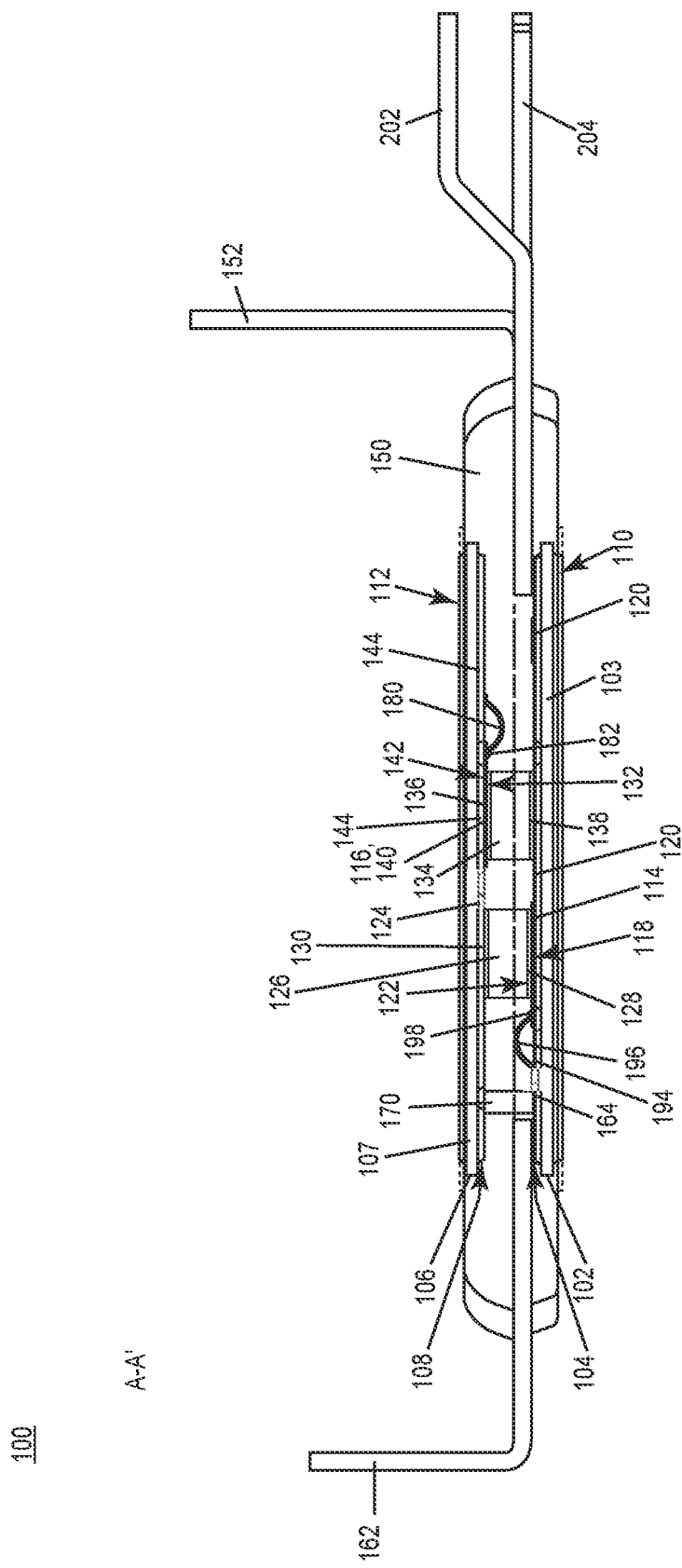
FIG. 3 illustrates a cross-sectional view of the power module along the line labelled A-A' in FIGS. 1 and 2.

FIG. 1 illustrates a top plan view of an embodiment of a power module 100. FIG. 2 illustrates a disassembled view of the power module 100. FIG. 3 illustrates a cross-sectional view of the power module 100 along the line labelled A-A' in FIGS. 1 and 2. The power module 100 may form part of a power electronics circuit for use in various power applications such as in a DC/AC inverter, a DC/DC converter, an AC/DC converter, a DC/AC converter, an AC/AC converter, a multi-phase inverter, an H-bridge, etc.

The power module 100 includes a first substrate 102 having a patterned first metallization 104 and a second substrate 106 vertically aligned with the first substrate 102. The second substrate 106 has a patterned second metallization 108 that faces the patterned first metallization 104 of the first substrate 102. The substrate metallizations 104, 108 that face one another are patterned to ensure proper routing of electrical connections for implementing a power electronics device included in the power module 100. Exemplary electrical connections are described in more detail later in the context of a half bridge. However, a half bridge is just one example of a power electronics device that may be included in the power module 100. The substrate metallizations 104, 108 that face one another may be patterned differently than what is illustrated in the figures, to facilitate electrical connections for any type of power electronics device included in the power module 100. The sides 110, 112 of the respective substrates 102, 106 that face away from one another may be metallized, e.g., to enable double-sided cooling (DSC) for the power module 100.

The first substrate 102 may be a direct bonded copper (DBC) substrate, an active metal brazed (AMB) substrate, or an insulated metal (IMS) substrate, where in each case an insulating body 103 such as a ceramic separates the metallized sides 104, 110 of the first substrate 102 from one another. The second substrate 106 may be a DBC substrate, an AMB substrate, or an IMS substrate, where in each case an insulating body 107 such as a ceramic separates the metallized sides 108, 112 of the second substrate 106 from one another. The insulating body 107 of the second substrate 106 instead may be omitted such that the second substrate 106 includes just a patterned metallization 108, e.g., such as a lead frame. The first and second substrates 102, 106 may be the same substrate type or different substrate types. The first substrate 102 and the second substrate 106 may have identical areas or different areas. In FIG. 2, the first and second substrates 102, 106 are shown side-by-side before the second substrate 106 is flipped from right to left and aligned vertically with the first substrate 102.

The power module 100 also includes first vertical power transistor dies 114 and second vertical power transistor dies 116. The power transistor dies 114, 116 are 'vertical' dies in that the primary current flow path is between the front and back sides of each die 114, 116. The drain terminal is typically disposed at the die backside, with gate and source terminals (and optionally one or more sense terminals) at the die frontside. Additional types of semiconductor dies may be included in the power module 100, such as power diode dies, logic dies, controller dies, gate driver dies, etc. In one embodiment, the first vertical power transistor dies 114 are SiC power MOSFET (metal-oxide-semiconductor field-effect transistor) dies and the second vertical power transistor dies 116 are also SiC power MOSFET dies. The first and second vertical power transistor dies 114, 116 instead may be Si power MOSFET dies, HEMT (high-electron mobility transistor) dies, IGBT (insulated-gate bipolar transistor) dies, JFET (junction filed-effect transistor) dies, etc.

The first vertical power transistor dies 114 included in the power module 100 may have a drain pad 118 attached to a first island 120 of the patterned first metallization 104 of the first substrate 102. At the opposite side, the first vertical power transistor dies 114 have a source pad 122 electrically connected to a first island 124 of the patterned second metallization 108 of the second substrate 106 via first spacers 126. The first spacers 126 may be attached to the source pad 122 of the first vertical power transistor dies 114 by a first attach material 128 such as solder, diffusion solder, glue, adhesive, etc. The first spacers 126 may be attached to the first island 124 of the patterned second metallization 108 of the second substrate 106 by a second attach material 130 such as solder, diffusion solder, glue, adhesive, etc. The first and second attach materials 128, 130 may comprise the same material or different materials.

The second vertical power transistor dies 116 included in the power module 100 may have a source pad 132 electrically connected to the first island 120 of the patterned first metallization 104 of the first substrate 102 via second spacers 134. The second spacers 134 may be attached to the source pad 132 of the second vertical power transistor dies 116 by a first attach material 136 such as solder, diffusion solder, glue, adhesive, etc. The second spacers 134 may be attached to the first island 120 of the patterned first metallization 104 of the first substrate 102 by a second attach material 138 such as solder, diffusion solder, glue, adhesive, etc. The first and second attach materials 136, 138 may comprise the same material or different materials.

A first subset 140 of the second vertical power transistor dies 116 may have a drain pad 142 at the opposite side as the corresponding source pad 132 and attached to a second island 144 of the patterned second metallization 108 of the second substrate 106. A second subset 146 of the second vertical power transistor dies 116 may have a drain pad (out of view in FIGS. 1 through 3) attached to a third island 148 of the patterned second metallization 108 of the second substrate 106. A mold compound 150 may encapsulate the first and second vertical power transistor dies 114, 116 and the respective spacers 126, 134.

In one embodiment, the first vertical power transistor dies 114 are electrically coupled in parallel to form a first switch of a half bridge and the second vertical power transistor dies 116 are electrically coupled in parallel to form a second switch of the half bridge. For example, the first vertical power transistor dies 114 may form the low-side switch of the half bridge and the second vertical power transistor dies 116 may form the high-side switch of the half bridge.

In the case of a half bridge implementation, an AC terminal 152 may be attached to the first island 120 of the patterned first metallization 104 of the first substrate 102 for providing the phase/AC output of the half bridge. The positive (high-side) DC input for the half bridge may be implemented as a first DC terminal 154 attached to a first additional island 156 of the patterned first metallization 104 of the first substrate 102 and a second DC terminal 158 attached to a second additional island 160 of the patterned first metallization 104 of the first substrate 102. The first and second DC terminals 154, 158 are at the same positive DC potential and only one positive DC terminal may be provided.

The negative (low-side) DC input for the half bridge may be implemented as a third DC terminal 162 attached to a third additional island 164 of the patterned first metallization 104 of the first substrate 102. The third DC terminal 162 may be interposed between the first and second DC terminals 154, 158 and is at a different potential than the first and second DC terminals 154, 158 and two negative terminals may be provided.

At least one first additional spacer 166 may electrically connect the first additional island 156 of the patterned first metallization 104 of the first substrate 102 to the second island 144 of the patterned second metallization 108 of the second substrate 106. At least one second additional spacer 168 may electrically connect the second additional island 160 of the patterned first metallization 104 of the first substrate 102 to the third island 148 of the patterned second metallization 108 of the second substrate 106. Each first additional spacer 166 provides the positive (high-side) DC input potential to the drain pad of the first subset 140 of the second vertical power transistor dies 116 via the second island 144 of the patterned second metallization 108 of the second substrate 106. Each second additional spacer 168 similarly provides the positive (high-side) DC input potential to the drain pad of the second subset 146 of the second vertical power transistor dies 116 via the third island 148 of the patterned second metallization 108 of the second substrate 106.

At least one third additional spacer 170 may electrically connect the third additional island 164 of the patterned first metallization 104 of the first substrate 102 to the first island 124 of the patterned second metallization 108 of the second substrate 106. Each third additional spacer 170 provides the negative (low-side) DC input potential to the second substrate 106. In one embodiment, the AC terminal 152 is attached to the first island 120 of the patterned first metallization 104 of the first substrate 102 at an opposite end of the first substrate 102 as the first, second, and third DC terminals 154, 158, 162.

Gate connections to the vertical power transistor dies 116 attached to the second substrate 106 may be implemented as follows. A first gate terminal 172 may be attached to a fourth additional island 174 of the patterned first metallization 104 of the first substrate 102. A fourth additional spacer 176 electrically connects the fourth additional island 174 of the patterned first metallization 104 of the first substrate 102 to at least one first additional (gate) island 178 of the patterned second metallization 108 of the second substrate 106. Wire bond connections 180 electrically connect the gate island 178 of the patterned second metallization 108 of the second substrate 106 to a gate pad 182 of the second vertical power transistor dies 116.

Gate connections to the vertical power transistor dies 114 attached to the first substrate 102 may be implemented as follows. A second gate terminal 184 may be attached to a fifth additional island 186 of the patterned first metallization 104 of the first substrate 102. A fifth additional spacer 188 electrically connects the fifth additional island 186 of the patterned first metallization 104 of the first substrate 102 to a second additional island 190 of the patterned second metallization 108 of the second substrate 106. A sixth additional spacer 192 electrically connects the second additional island 190 of the patterned second metallization 108 of the second substrate 106 to a sixth additional (gate) island 194 of the patterned first metallization 104 of the first substrate 102. Wire bond connections 196 electrically connect the gate island 194 of the patterned first metallization 104 of the first substrate 102 to a gate pad 198 of the first vertical power transistor dies 114.

All power input, output, and gate terminals 152, 154, 162 of a half bridge or other power electronics device included in the power module 100 may be attached to the first substrate 102 even though some of the vertical power transistor dies 116 are attached to the second substrate 106. Respective spacers 166, 168, 176, 188, 192 provide the corresponding electrical connections to the patterned second metallization 108 of the second substrate 106. One or more additional terminals 200, 202, 204, 206 may be attached to the first substrate 102. For example, a pair of temperature sense terminals 200, 202 may be electrically connected to a temperature sensor 208 such as an NTC (negative temperature coefficient) sensor attached to the patterned first metallization 104 of the first substrate 102. Another sense terminal 204 may be attached to the island 156 of the patterned first metallization 104 of the first substrate 102 that is at the positive (high-side) DC input potential, for sensing the positive (high-side) DC input potential. Another sense terminal 206 attached to the patterned first metallization 104 of the first substrate 102 may be provided for sensing the negative (low-side) DC input potential, e.g., via another spacer 210 that is attached to the patterned first metallization 104 of the first substrate 102 at one end of the spacer 210 and to the first island 124 of the patterned second metallization 108 of the second substrate 106 at the opposite end of the spacer 210.

FIG. 4A is a plan view of the first substrate 102 without the first die spacers 126, to provide an unobstructed view of the source pads 122 of the first vertical power transistor dies 114. FIG. 4B is a plan view of the second substrate 106 without the second die spacers 134, to provide an unobstructed view of the source pads 132 of the second vertical power transistor dies 116. The sides of the substrates 102, 106 shown in FIGS. 4A and 4B face one another in the final module 100, e.g., by flipping the second substrate 106 onto the first substrate 102 or by flipping the first substrate 102 onto the second substrate 106, with the second substrate 106 having the second vertical power transistor dies 116 attached thereto being vertically aligned with the first substrate 102 having the first vertical power transistor dies 114 attached thereto such that the patterned second metallization 108 of the second substrate 106 faces the patterned first metallization 104 of the first substrate 102.

After vertically aligning the first and second substrates 102, 106, the source pad 122 of the first vertical power transistor dies 114 is electrically connected to the first island 124 of the patterned second metallization 108 of the second substrate 106 via first die spacers 122 and the source pad 132 of the second vertical power transistor dies 116 is electrically connected to the first island 120 of the patterned first metallization 104 of the first substrate 102 via second die spacers 132. The other spacer connections described herein are also completed after vertically aligning the first and second substrates 102, 106. The wire bond connections 180, 198 are completed before vertically aligning the first and second substrates 102, 106. Also before vertically aligning the first and second substrates 102, 106, the first vertical power transistor dies 114 attached to the first substrate 102 and the second vertical power transistor dies 116 attached to the second substrate 106 may be separately tested. If one or more of the vertical power transistor dies 114 (116) attached to one of the substrates 102 (106) failed the testing and all of the vertical power transistor dies 116 (114) attached to the other substrate 106 (102) passed the testing, the vertical power transistor dies 114 (116) attached to the substrate 102 (106) with one or more failing vertical power transistor dies may be replaced without replacing the vertical power transistor dies 116 (114) attached to the substrate 106 (102) without any failing vertical power transistor dies.

In FIGS. 2, 4A and 4B, the smaller dashed rectangles indicate where the non-die spacers 166, 168, 170, 176, 188, 192, 210 attached to one substrate 102 (104) contact the other substrate 104 (102). Similarly, the larger dashed rectangles indicate where the die spacers 126, 124 attached to the source pad 124 (132) of one group of vertical transistor dies 114 (116) contact the facing substrate 102 (104). The spacers 126, 134, 166, 168, 170, 176, 188, 192, 210 may comprise, e.g., AlSiC which is an aluminum matrix with silicon carbide particles and where AlSiC exhibits very poor solder wetting. Other thermally and electrically conductive materials may be used for the spacers 126, 134, 166, 168, 170, 176, 188, 192, 210.

The substrate metallizations 104, 108 that face one another may be patterned to accommodate different layouts of the first and second vertical power transistor dies 114, 116. For example, in FIG. 2, the first vertical power transistor dies 114 are arranged in a first row R1 and the second vertical power transistor dies 116 are arranged in a second row between opposing edges of the power module 100.

Figure 5:
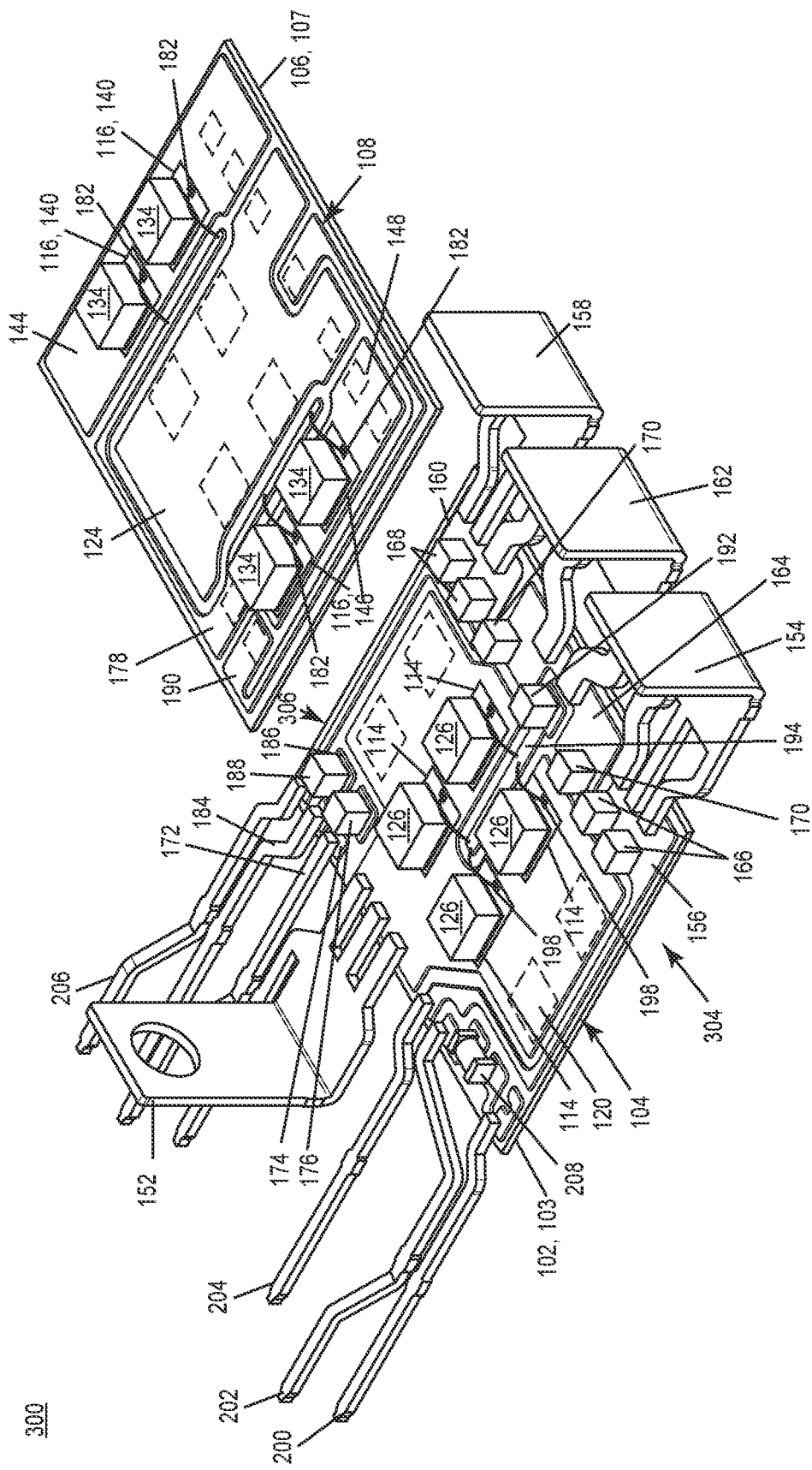
FIG. 5 illustrates a disassembled view of a power module, according to another embodiment.
Figure 6:
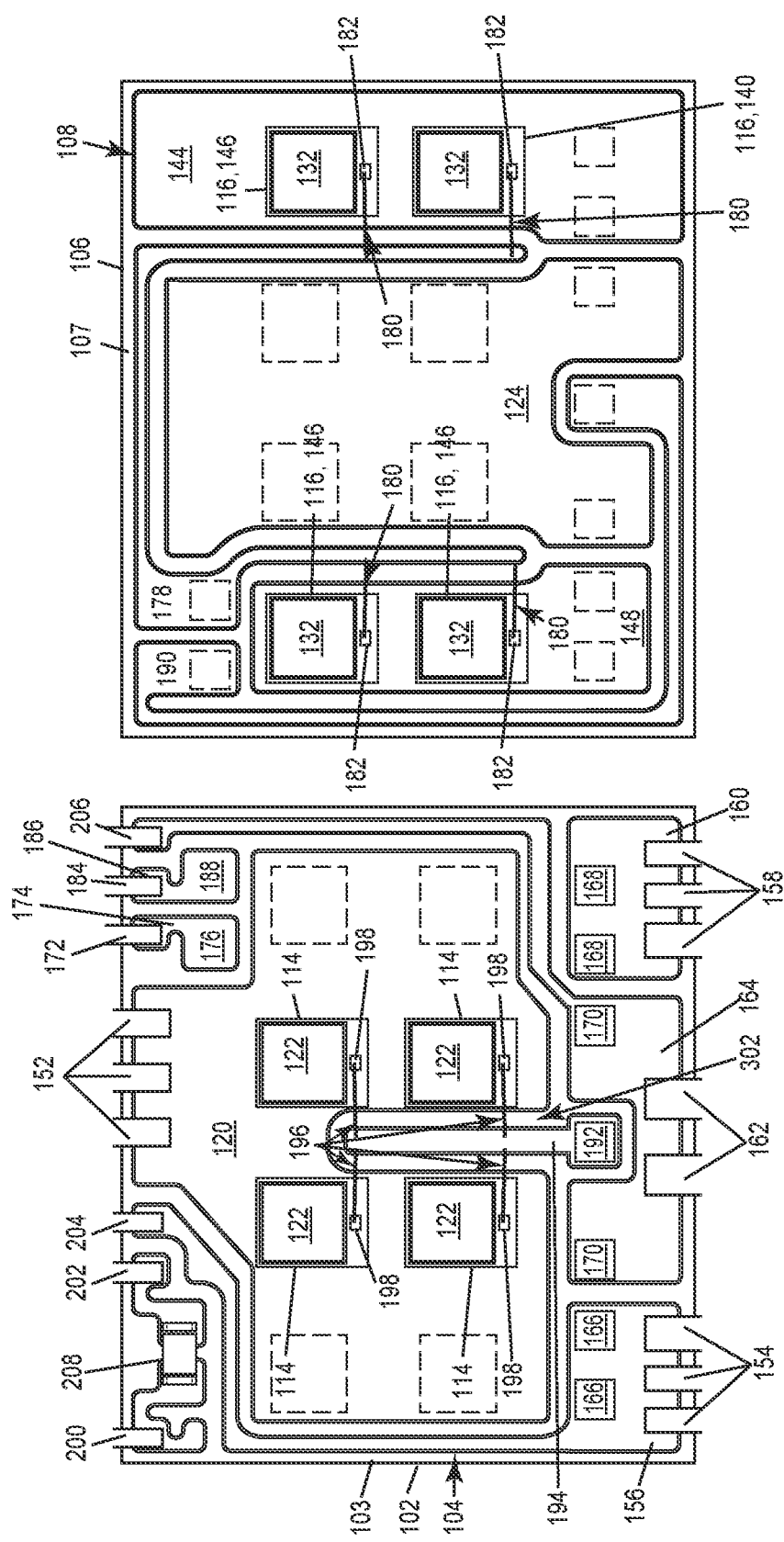
FIG. 6A is a plan view of a first substrate of the power module of FIG. 5.
FIG. 6B is a plan view of a second substrate of the power module of FIG. 5.

FIG. 5 illustrates a disassembled view of another embodiment of a power module 300, prior to substrate alignment and molding. FIG. 6A is a plan view of the first substrate 102 included in the power module 300 of FIG. 5 but without the first die spacers 126, to provide an unobstructed view of the source pads 122 of the first vertical power transistor dies 114. FIG. 6B is a plan view of the second substrate 106 included in the power module 300 of FIG. 5 but without the second die spacers 134, to provide an unobstructed view of the source pads 132 of the second vertical power transistor dies 116. The embodiment shown in FIG. 5 is similar to the embodiment shown in FIG. 2, but with a different layout for the patterned substrate metallizations 104, 108 that face one another.

In FIG. 5, the island 194 of the patterned first metallization 104 of the first substrate 102 that provides the gate signal connection to the first vertical power transistor dies 114 jets into a recess 302 in the first island 120 of the patterned first metallization 104 of the first substrate 102. The wire bond connections 196 to the gate pad 198 of the first vertical power transistor dies 114 span the recess 302 in the first island 120 of the patterned first metallization 104 of the first substrate 102.

Separately or in combination, the island 178 of the patterned second metallization 108 of the second substrate 106 that provides the gate signal connection to the second vertical power transistor dies 116 may extend between the first and second islands 124, 144 of the patterned second metallization 108 of the second substrate 104 and between the first and third islands 124, 148 of the patterned second metallization 108 of the second substrate 106. In the case of a half bridge power electronics device included in the power module 300, the first island 124 of the patterned second metallization 108 of the second substrate 106 is as at a negative (low-side) DC input potential and the second and third islands 144, 148 of the patterned second metallization 108 of the second substrate 106 are at a positive (high-side) DC input potential.

Regarding the die layout illustrated in FIGS. 5, 6A and 6B, the first vertical power transistor dies 114 are flanked on a first side by the first subset 140 of the second vertical power transistor dies 116 and flanked on a second side opposite the first side by the second subset 146 of the second vertical power transistor dies 116. That is, between opposing first and second edges 304, 306 of the power module 300, the first subset 140 of the second vertical power transistor dies 116 may be interposed between the first edge 304 and the first vertical power transistor dies 114 and the second subset 146 of the second vertical power transistor dies 116 may be interposed between the second edge 306 and the first vertical power transistor dies 114.

Figure 7:
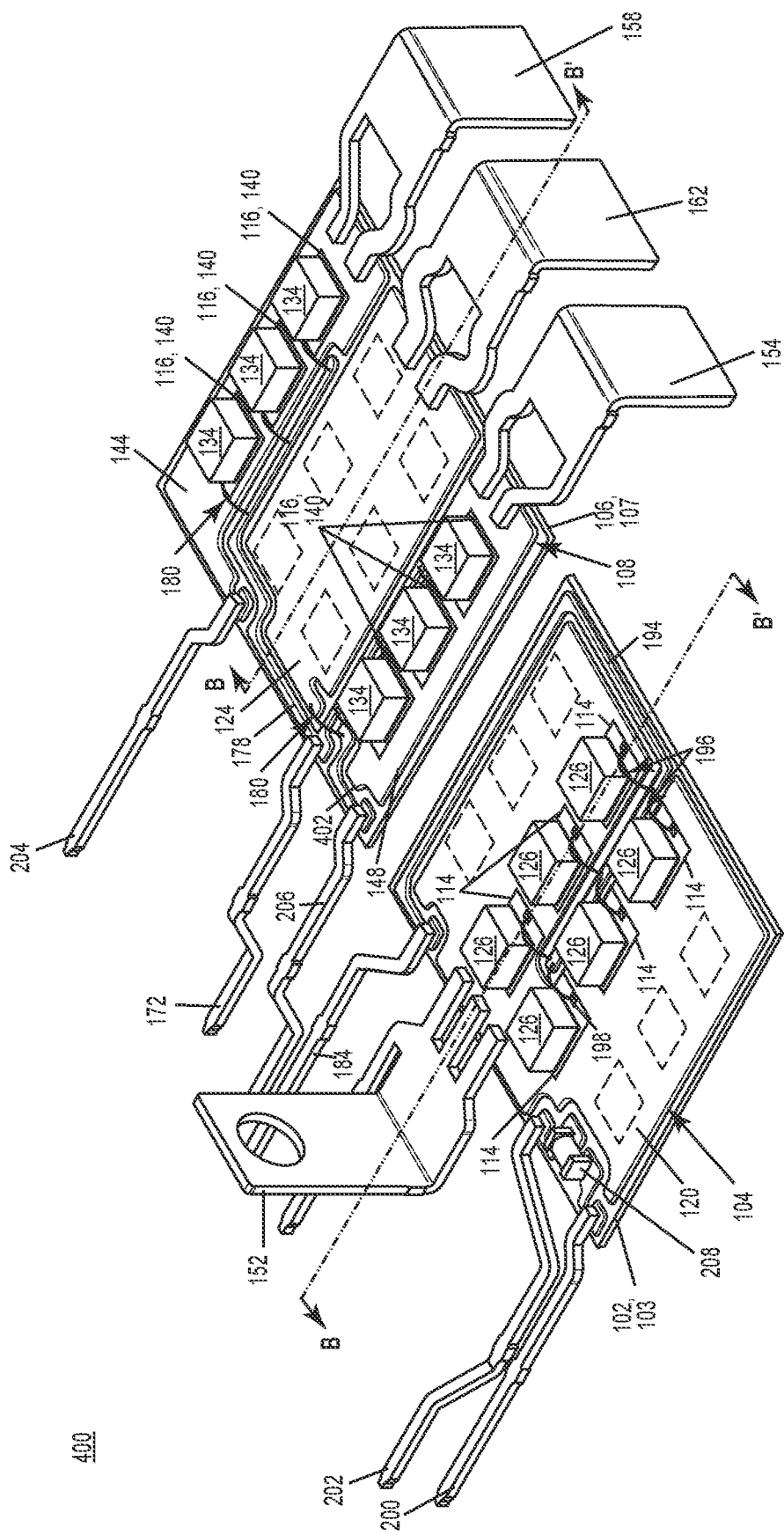
FIG. 7 illustrates a disassembled view of another embodiment of a power module.
Figure 8:
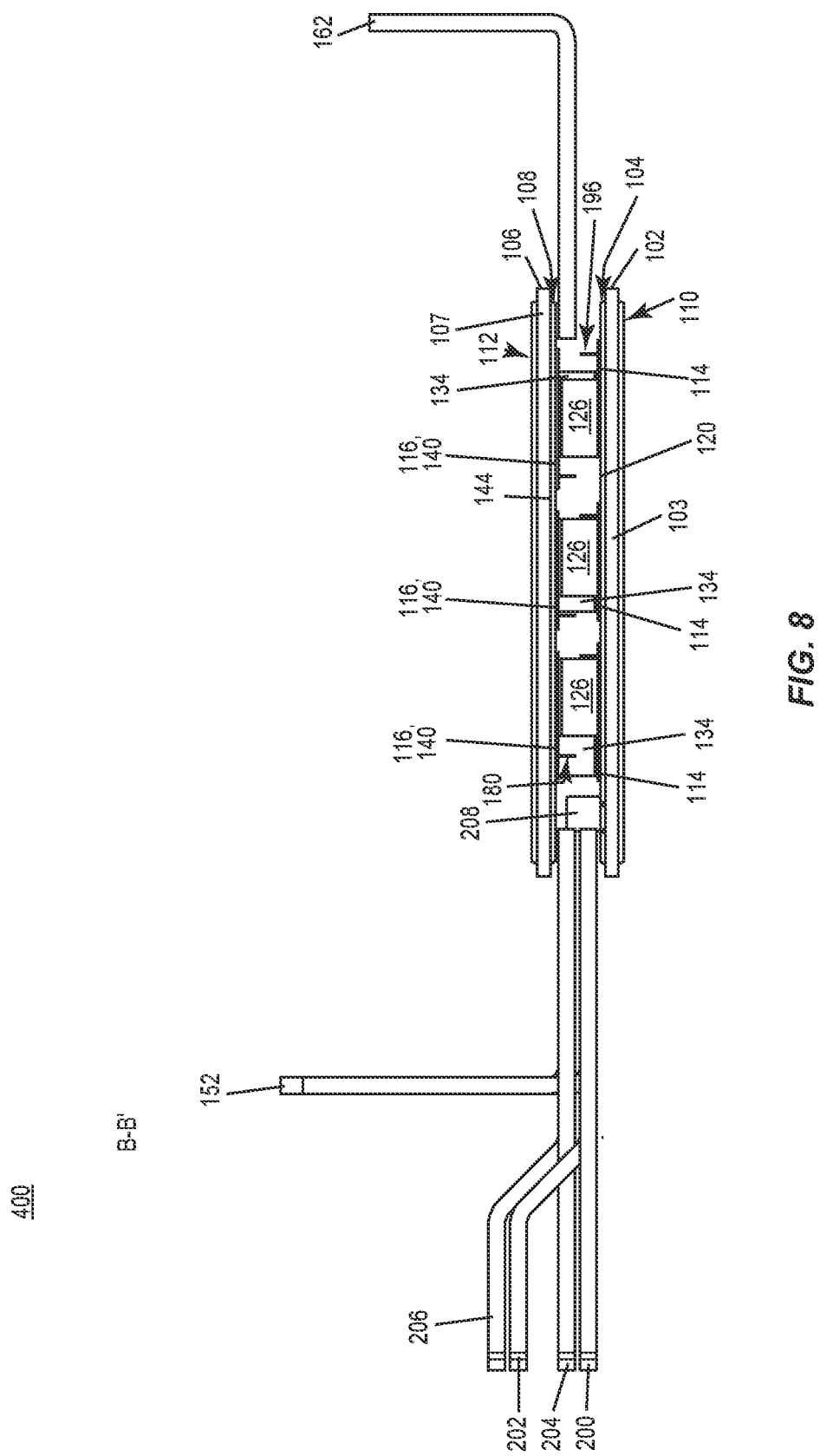
FIG. 8 illustrates a cross-sectional view of the power module along the line labelled B-B' in FIG. 7.

FIG. 7 illustrates a disassembled view of another embodiment of a power module 400, prior to substrate alignment and molding. FIG. 8 illustrates a cross-sectional view of the power module 400 along the line labelled B-B' in FIG. 7, after substrate alignment but before molding. The embodiment shown in FIG. 7 is similar to the embodiments shown in FIG. 5, but with some power and signal pins 152, 184, 200, 202 attached to the first substrate 102 and other power and signal pins 154, 158, 162, 172, 204, 206 attached to the second substrate 106. Accordingly, spacers are not needed to provide power and signal connections between the substrates 102, 106, since the power and signal connections for the second vertical power transistor dies 116 are provided by corresponding power and signal pins 154, 158, 162, 172, 204, 206 attached to the second substrate 106.

The only spacers used in FIGS. 7 and 8 are the first die spacers 126 for electrically connecting the first vertical power transistor dies 114 to the patterned second metallization 108 of the second substrate 106 and the second die spacers 134 for electrically connecting the second vertical power transistor dies 116 to the patterned first metallization 104 of the first substrate 102. The module configuration shown in FIGS. 7 and 8 with reduced spacer usage further lowers loop inductance, yielding lower stray inductance. Additional chip area also becomes available by omitting the power and signal connection spacers. Further, the module outline (pin-out, mold body, etc.) is unaffected.

In FIGS. 7 and 8, the first DC terminal 154 is attached to the third island 148 of the patterned second metallization 108 of the second substrate 106 and the second DC terminal 158 is attached to the second island 144 of the patterned second metallization 108 of the second substrate 106. The third DC terminal 162 is attached to the first island 124 of the patterned second metallization 108 of the second substrate 106. Accordingly, spacers are not needed to bring the positive (high-side) and negative (low-side) DC input potentials to the second substrate 106. The third DC terminal 162 may be interposed between the first and second DC terminals 154, 158, for example.

Also in FIGS. 7 and 8, the gate terminal 172 for the second vertical power transistor dies 116 is attached to a gate island 178 of the patterned second metallization 108 of the second substrate 106. Wire bond connections 180 electrically connect the gate island 178 of the patterned second metallization 108 of the second substrate 106 to the gate pad 182 of each second vertical power transistor die 116. Accordingly, spacers are not needed to bring the gate signal input for the second vertical power transistor dies 116 to the second substrate 106. The terminals 204, 206 for sensing the positive (high-side) and negative (low-side) DC input potentials likewise may be attached to respective islands 144, 402 of the patterned second metallization 108 of the second substrate 106. Accordingly, spacers are not needed to bring the sensed positive (high-side) and negative (low-side) DC input potentials to the first substrate 102.

Figure 9:
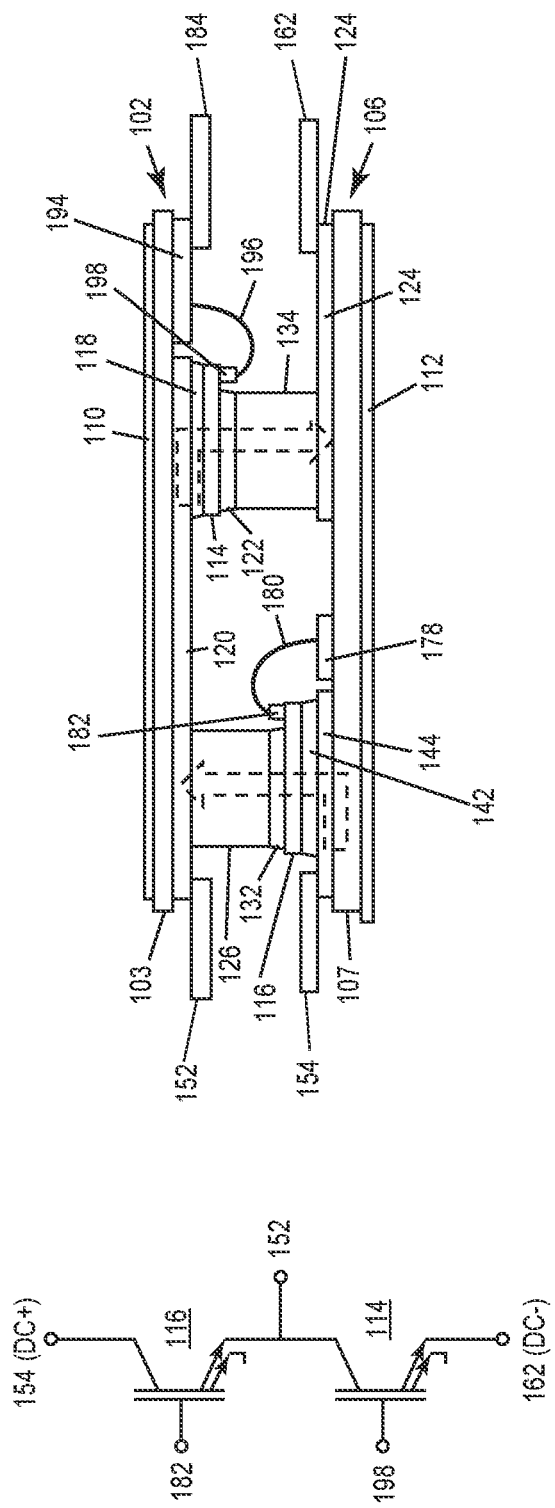
FIG. 9 illustrates both a circuit schematic of an exemplary half bridge formed by a pair of first and second vertical power transistor dies and a corresponding cross-sectional module view for the half bridge implementation but without the mold compound, according to the embodiment of FIG. 7.

FIG. 9 illustrates both a circuit schematic of an exemplary half bridge formed by a pair of the first and second vertical power transistor dies 114, 116 and a corresponding cross-sectional module view for the half bridge implementation but without the mold compound 150, to provide an unobstructed view of the substrates 102, 106 and the vertical power transistor dies 114, 116. The high-side (DC+) to phase current path through the second vertical power transistor die 116 is indicated by an upward facing dashed arrow whereas the phase to low-side (DC−) current path through the first vertical power transistor die 114 is indicated by a downward facing dashed arrow. The power module embodiments described herein avoid additional current loops which reduces inductance.

Figure 10:
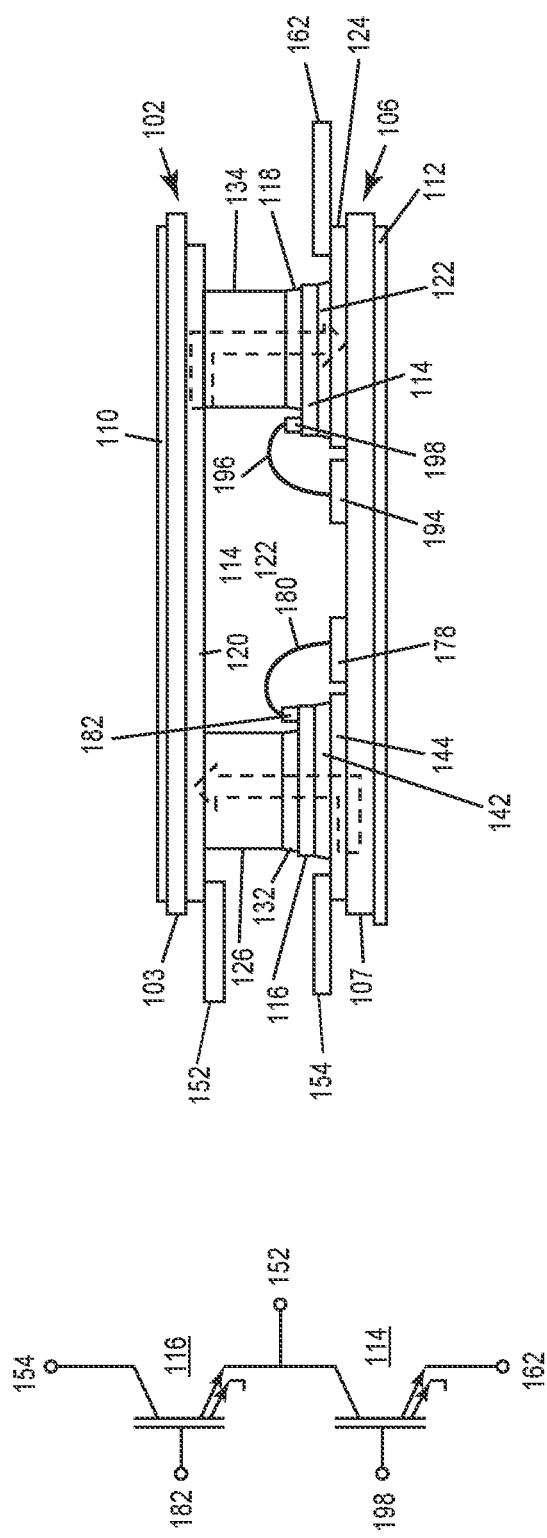
FIG. 10 illustrates both a circuit schematic of an exemplary half bridge formed by a pair of first and second vertical power transistor dies and a corresponding cross-sectional module view for the half bridge implementation but without the mold compound, according to an embodiment with a pair of drain-down and source-down vertical power transistors.

FIG. 10 illustrates both a circuit schematic of an exemplary half bridge formed by a pair of the first and second vertical power transistor dies 114, 116 and a corresponding cross-sectional module view for the half bridge implementation but without the mold compound 150, to provide an unobstructed view of the substrates 102, 106 and the vertical power transistor dies 114, 116. The embodiment shown in FIG. 10 is similar to the embodiment shown in FIG. 9. In FIG. 10, different die configurations are used for the first and second vertical power transistor dies 114, 116. The second (high-side) vertical power transistor die 116 has a source pad 132 and a gate pad 182 at the front side of the die 116 and a drain pad 142 at the die backside. The first (low-side) vertical power transistor die 114 has a drain pad 118 and a gate pad 198 at the front side of the die 114 and a source pad 122 at the die backside. Flipping the source and drain pad arrangements in this way for the first (low-side) vertical power transistor die 114 simplifies the layout of the patterned first and second metallizations 104, 108 while also avoiding additional current loops.

Figure 11:
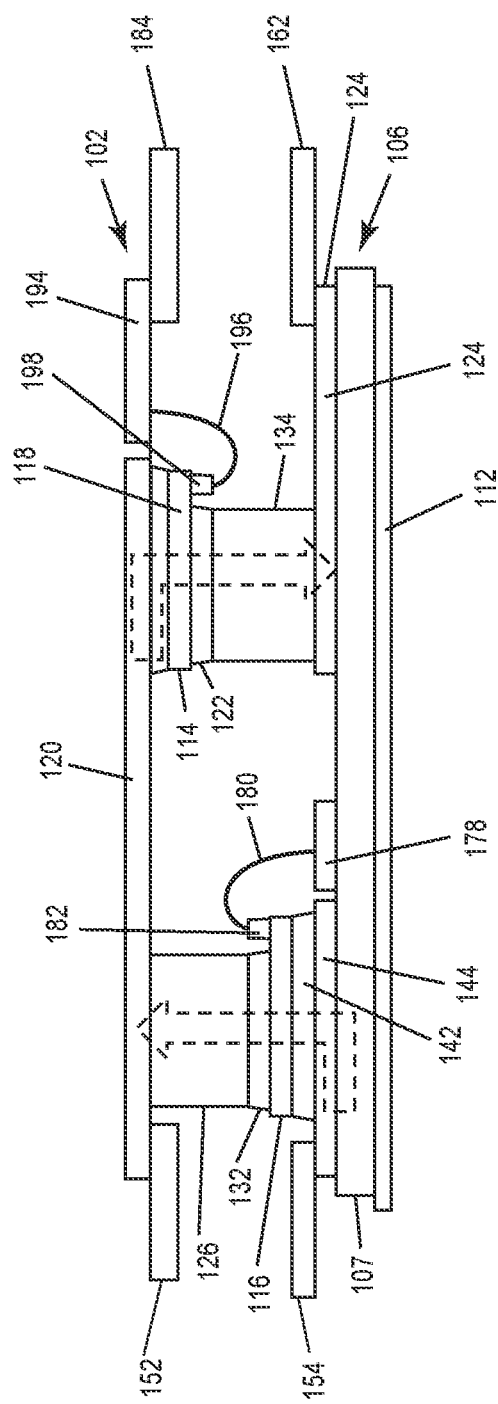
FIG. 11 illustrates a single-side cooling embodiment of a molded power module.

FIG. 11 illustrates a cross-sectional module view of an exemplary half bridge power module formed by a pair of the first and second vertical power transistor dies 114, 116 but without the mold compound 150, to provide an unobstructed view of the substrates 102, 106 and the vertical power transistor dies 114, 116. The module embodiment shown in FIG. 11 is similar to the module embodiment shown in FIG. 9. In FIG. 11, the first (upper) substrate 102 comprises just the patterned first metallization 104 (no insulating body 103 with opposing metallized side 11). In this case, the patterned first metallization 104 which may be implemented as a lead frame and the first (upper) substrate 102 may or may not be embedded in a mold compound or other electrically insulative material. If the first (upper) substrate 102 is embedded in a mold compound or other electrically insulative material, the main heat dissipation for all vertical power transistor dies 114, 116 is through the bottom side (single-sided cooling) of the power module via the second (lower) substrate 106.

Although the present disclosure is not so limited, the following numbered examples demonstrate one or more aspects of the disclosure.

Example 1. A power module, comprising: a first substrate comprising a patterned first metallization; a second substrate vertically aligned with the first substrate and comprising a patterned second metallization that faces the patterned first metallization; a first plurality of vertical power transistor dies having a drain pad attached to a first island of the patterned first metallization and a source pad electrically connected to a first island of the patterned second metallization via a first plurality of spacers; and a second plurality of vertical power transistor dies having a source pad electrically connected to the first island of the patterned first metallization via a second plurality of spacers, wherein a first subset of the second plurality of vertical power transistor dies has a drain pad attached to a second island of the patterned second metallization and a second subset of the second plurality of vertical power transistor dies has a drain pad attached to a third island of the patterned second metallization.

Example 2. The power module of example 1, wherein the patterned first metallization comprises an additional island, and wherein wire bond connections are formed between the additional island of the patterned first metallization and a gate pad of the first plurality of vertical power transistor dies.

Example 3. The power module of example 2, wherein the additional island of the patterned first metallization jets into a recess in the first island of the patterned first metallization, and wherein the wire bond connections span the recess.

Example 4. The power module of any of examples 1 through 3, wherein the patterned second metallization comprises at least one first additional island, and wherein first wire bond connections are formed between the at least one first additional island of the patterned second metallization and a gate pad of the second plurality of vertical power transistor dies.

Example 5. The power module of example 4, further comprising: a first gate terminal attached to a first additional island of the patterned first metallization; and a first additional spacer electrically connecting the first additional island of the patterned first metallization to the first additional island of the patterned second metallization.

Example 6. The power module of example 5, further comprising: a second gate terminal attached to a second additional island of the patterned first metallization; a second additional spacer electrically connecting the second additional island of the patterned first metallization to a second additional island of the patterned second metallization; a third additional spacer electrically connecting the second additional island of the patterned second metallization to a third additional island of the patterned first metallization; and second wire bond connections between the third additional island of the patterned first metallization and a gate pad of the first plurality of vertical power transistor dies.

Example 7. The power module of any of examples 4 through 6, wherein the at least one first additional island of the patterned second metallization extends between the first island and the second island of the patterned second metallization and between the first island and the third island of the patterned second metallization.

Example 8. The power module of example 4, further comprising: a first gate terminal attached to the at least one first additional island of the patterned second metallization.

Example 9. The power module of example 8, further comprising: a second gate terminal attached to a second additional island of the patterned first metallization; and second wire bond connections between the second additional island of the patterned first metallization and a gate pad of the first plurality of vertical power transistor dies.

Example 10. The power module of any of examples 1 through 9, wherein the first plurality of vertical power transistor dies is electrically coupled in parallel to form a first switch of a half bridge, and wherein the second plurality of vertical power transistor dies are electrically coupled in parallel to form a second switch of the half bridge.

Example 11. The power module of example 10, further comprising: an AC terminal attached to the first island of the patterned first metallization; a first DC terminal attached to a first additional island of the patterned first metallization; a second DC terminal attached to a second additional island of the patterned first metallization, the second DC terminal being at the same potential as the first DC terminal; a third DC terminal attached to a third additional island of the patterned first metallization, the third DC terminal interposed between the first and second DC terminals and being at a different potential than the first and second DC terminals; at least one first additional spacer electrically connecting the first additional island of the patterned first metallization to the second island of the patterned second metallization; at least one second additional spacer electrically connecting the second additional island of the patterned first metallization to the third island of the patterned second metallization; and at least one third additional spacer electrically connecting the third additional island of the patterned first metallization to the first island of the patterned second metallization.

Example 12. The power module of example 11, wherein the AC terminal is attached to the first island of the patterned first metallization at an opposite end of the first substrate as the first, second, and third DC terminals.

Example 13. The power module of example 11 or 12, further comprising: a first gate terminal attached to a fourth additional island of the patterned first metallization; a fourth additional spacer electrically connecting the fourth additional island of the patterned first metallization to at least one first additional island of the patterned second metallization; and first wire bond connections formed between the first additional island of the patterned second metallization and a gate pad of the second plurality of vertical power transistor dies.

Example 14. The power module of example 13, further comprising: a second gate terminal attached to a fifth additional island of the patterned first metallization; a fifth additional spacer electrically connecting the fifth additional island of the patterned first metallization to a second additional island of the patterned second metallization; a sixth additional spacer electrically connecting the second additional island of the patterned second metallization to a sixth additional island of the patterned first metallization; and second wire bond connections between the sixth additional island of the patterned first metallization and a gate pad of the first plurality of vertical power transistor dies.

Example 15. The power module of example 10, further comprising: an AC terminal attached to the first island of the patterned first metallization; a first DC terminal attached to the second island of the patterned second metallization; a second DC terminal attached to the third island of the patterned second metallization, the second DC terminal being at the same potential as the first DC terminal; and a third DC terminal attached to the first island of the patterned second metallization, the third DC terminal interposed between the first and second DC terminals and being at a different potential than the first and second DC terminals.

Example 16. The power module of example 15, further comprising: a first gate terminal attached to at least one first additional island of the patterned second metallization; and first wire bond connections between the at least one first additional island of the patterned second metallization and a gate pad of the second plurality of vertical power transistor dies.

Example 17. The power module of example 16, further comprising: a second gate terminal attached to a second additional island of the patterned first metallization; and second wire bond connections between the second additional island of the patterned first metallization and a gate pad of the first plurality of vertical power transistor dies.

Example 18. The power module of any of examples 1 through 17, wherein the first plurality of vertical power transistor dies comprises SiC power MOSFET (metal-oxide-semiconductor field-effect transistor) dies, and wherein the second plurality of vertical power transistor dies comprises SiC power MOSFET dies.

Example 19. The power module of any of examples 1 through 18, wherein the first substrate is a direct bonded copper substrate, an active metal brazed substrate, or an insulated metal substrate, and wherein the second substrate is a direct bonded copper substrate, an active metal brazed substrate, or an insulated metal substrate.

Example 20. The power module of any of examples 1 through 19, wherein the first substrate and the second substrate have identical areas.

Example 21. The power module of any of examples 1 through 19, wherein the first plurality of vertical power transistor dies is flanked on a first side by the first subset of the second plurality of vertical power transistor dies, and wherein the first plurality of vertical power transistor dies is flanked on a second side opposite the first side by the second subset of the second plurality of vertical power transistor dies.

Example 22. The power module of any of examples 1 through 21, wherein between opposing first and second edges of the power module, the first plurality of vertical power transistor dies is arranged in a first row and the second plurality of vertical power transistor dies is arranged in a second row.

Example 23. The power module of any of examples 1 through 22, wherein between opposing first and second edges of the power module, the first subset of the second plurality of vertical power transistor dies is interposed between the first edge and the first plurality of vertical power transistor dies and the second subset of the second plurality of vertical power transistor dies is interposed between the second edge and the first plurality of vertical power transistor dies.

Example 24. A method of producing a power module, the method comprising: attaching a drain pad of a first plurality of vertical power transistor dies to a first island of a patterned first metallization of a first substrate; attaching a drain pad of a first subset of a second plurality of vertical power transistor dies to a second island of a patterned second metallization of a second substrate; attaching a drain pad of a second subset of the second plurality of vertical power transistor dies to a third island of the patterned second metallization; vertically aligning the second substrate having the second plurality of vertical power transistor dies attached thereto with the first substrate having the first plurality of vertical power transistor dies attached thereto, such that the patterned second metallization faces the patterned first metallization; after the vertically aligning, electrically connecting a source pad of the first plurality of vertical power transistor dies to a first island of the patterned second metallization via a first plurality of spacers and electrically connecting a source pad of the second plurality of vertical power transistor dies to the first island of the patterned first metallization via a second plurality of spacers.

Example 25. The method of example 24, further comprising: before the vertically aligning, separately testing the first plurality of vertical power transistor dies attached to the first substrate and the second plurality of vertical power transistor dies attached to the second substrate; and if one or more of the vertical power transistor dies attached to one of the substrates failed the testing and all of the vertical power transistor dies attached to the other substrate passed the testing, replacing the vertical power transistor dies attached to the substrate with one or more failing vertical power transistor dies without replacing the vertical power transistor dies attached to the substrate without any failing vertical power transistor dies.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module, comprising:
a first substrate comprising a patterned first metallization;
a second substrate vertically aligned with the first substrate and comprising a patterned second metallization that faces the patterned first metallization;
a first plurality of vertical power transistor dies having a drain pad attached to a first island of the patterned first metallization and a source pad electrically connected to a first island of the patterned second metallization via a first plurality of spacers; and
a second plurality of vertical power transistor dies having a source pad electrically connected to the first island of the patterned first metallization via a second plurality of spacers,
wherein a first subset of the second plurality of vertical power transistor dies has a drain pad attached to a second island of the patterned second metallization and a second subset of the second plurality of vertical power transistor dies has a drain pad attached to a third island of the patterned second metallization.

2. The power module of claim 1, wherein the patterned first metallization comprises a gate island, and wherein wire bond connections are formed between the gate island of the patterned first metallization and a gate pad of the first plurality of vertical power transistor dies.

3. The power module of claim 1, wherein the patterned second metallization comprises at least one gate island, and wherein first wire bond connections are formed between the at least one gate island of the patterned second metallization and a gate pad of the second plurality of vertical power transistor dies.

4. The power module of claim 3, further comprising:
a first gate terminal attached to a first additional island of the patterned first metallization; and
a first additional spacer electrically connecting the first additional island of the patterned first metallization to the at least one gate island of the patterned second metallization.

5. The power module of claim 4, further comprising:
a second gate terminal attached to a second additional island of the patterned first metallization;
a second additional spacer electrically connecting the second additional island of the patterned first metallization to a first additional island of the patterned second metallization;
a third additional spacer electrically connecting the first additional island of the patterned second metallization to a gate island of the patterned first metallization; and
second wire bond connections between the gate island of the patterned first metallization and a gate pad of the first plurality of vertical power transistor dies.

6. The power module of claim 3, wherein the at least one gate island of the patterned second metallization extends between the first island and the second island of the patterned second metallization and between the first island and the third island of the patterned second metallization.

7. The power module of claim 3, further comprising:
a first gate terminal attached to the at least one gate island of the patterned second metallization.

8. The power module of claim 7, further comprising:
a second gate terminal attached to a gate island of the patterned first metallization; and
second wire bond connections between the gate island of the patterned first metallization and a gate pad of the first plurality of vertical power transistor dies.

9. The power module of claim 1, wherein the first plurality of vertical power transistor dies is electrically coupled in parallel to form a first switch of a half bridge, and wherein the second plurality of vertical power transistor dies are electrically coupled in parallel to form a second switch of the half bridge.

10. The power module of claim 9, further comprising:
an AC terminal attached to the first island of the patterned first metallization;
a first DC terminal attached to a first additional island of the patterned first metallization;

a second DC terminal attached to a second additional island of the patterned first metallization, the second DC terminal being at the same potential as the first DC terminal;
a third DC terminal attached to a third additional island of the patterned first metallization, the third DC terminal interposed between the first and second DC terminals and being at a different potential than the first and second DC terminals;
at least one first additional spacer electrically connecting the first additional island of the patterned first metallization to the second island of the patterned second metallization;
at least one second additional spacer electrically connecting the second additional island of the patterned first metallization to the third island of the patterned second metallization; and
at least one third additional spacer electrically connecting the third additional island of the patterned first metallization to the first island of the patterned second metallization.

11. The power module of claim 10, further comprising:
a first gate terminal attached to a fourth additional island of the patterned first metallization;
a fourth additional spacer electrically connecting the fourth additional island of the patterned first metallization to at least one gate island of the patterned second metallization; and
first wire bond connections formed between the at least one gate island of the patterned second metallization and a gate pad of the second plurality of vertical power transistor dies.

12. The power module of claim 11, further comprising:
a second gate terminal attached to a fifth additional island of the patterned first metallization;
a fifth additional spacer electrically connecting the fifth additional island of the patterned first metallization to a second additional island of the patterned second metallization;
a sixth additional spacer electrically connecting the second additional island of the patterned second metallization to a gate island of the patterned first metallization; and
second wire bond connections between the gate island of the patterned first metallization and a gate pad of the first plurality of vertical power transistor dies.

13. The power module of claim 9, further comprising:
a first gate terminal attached to at least one gate island of the patterned second metallization; and
first wire bond connections between the at least one gate island of the patterned second metallization and a gate pad of the second plurality of vertical power transistor dies.

14. The power module of claim 13, further comprising:
a second gate terminal attached to a gate island of the patterned first metallization; and
second wire bond connections between the gate island of the patterned first metallization and a gate pad of the first plurality of vertical power transistor dies.

15. The power module of claim 9, further comprising:
an AC terminal attached to the first island of the patterned first metallization;
a first DC terminal attached to the second island of the patterned second metallization;
a second DC terminal attached to the third island of the patterned second metallization, the second DC terminal being at the same potential as the first DC terminal;
a third DC terminal attached to the first island of the patterned second metallization, the third DC terminal interposed between the first and second DC terminals and being at a different potential than the first and second DC terminals.

16. The power module of claim 1, wherein the first substrate and the second substrate have identical areas.

17. The power module of claim 1, wherein the first plurality of vertical power transistor dies is flanked on a first side by the first subset of the second plurality of vertical power transistor dies, and wherein the first plurality of vertical power transistor dies is flanked on a second side opposite the first side by the second subset of the second plurality of vertical power transistor dies.

18. The power module of claim 1, wherein between opposing first and second edges of the power module, the first subset of the second plurality of vertical power transistor dies is interposed between the first edge and the first plurality of vertical power transistor dies and the second subset of the second plurality of vertical power transistor dies is interposed between the second edge and the first plurality of vertical power transistor dies.

19. A method of producing a power module, the method comprising:
attaching a drain pad of a first plurality of vertical power transistor dies to a first island of a patterned first metallization of a first substrate;
attaching a drain pad of a first subset of a second plurality of vertical power transistor dies to a second island of a patterned second metallization of a second substrate;
attaching a drain pad of a second subset of the second plurality of vertical power transistor dies to a third island of the patterned second metallization;
vertically aligning the second substrate having the second plurality of vertical power transistor dies attached thereto with the first substrate having the first plurality of vertical power transistor dies attached thereto, such that the patterned second metallization faces the patterned first metallization;
after the vertically aligning, electrically connecting a source pad of the first plurality of vertical power transistor dies to a first island of the patterned second metallization via a first plurality of spacers and electrically connecting a source pad of the second plurality of vertical power transistor dies to the first island of the patterned first metallization via a second plurality of spacers.

20. The method of claim 19, further comprising:
before the vertically aligning, separately testing the first plurality of vertical power transistor dies attached to the first substrate and the second plurality of vertical power transistor dies attached to the second substrate; and
if one or more of the vertical power transistor dies attached to one of the substrates failed the testing and all of the vertical power transistor dies attached to the other substrate passed the testing, replacing the vertical power transistor dies attached to the substrate with one or more failing vertical power transistor dies without replacing the vertical power transistor dies attached to the substrate without any failing vertical power transistor dies.

* * * * *